United States Patent
Iketani et al.

(10) Patent No.: US 10,237,983 B2
(45) Date of Patent: Mar. 19, 2019

(54) METHOD FOR FORMING HOLE PLUG

(71) Applicant: Sanmina Corporation, San Jose, CA (US)

(72) Inventors: Shinichi Iketani, Sunnyvale, CA (US); Dale Kersten, Ben Lomond, CA (US)

(73) Assignee: SANMINA CORPORATION, San Jose, CA (US)

( * ) Notice: Subject to any disclaimer, the term of this patent is extended or adjusted under 35 U.S.C. 154(b) by 85 days.

(21) Appl. No.: 14/998,135

(22) Filed: Dec. 23, 2015

(65) Prior Publication Data

US 2016/0219703 A1 Jul. 28, 2016

Related U.S. Application Data (60) Provisional application No. 62/096,011, filed on Dec. 23, 2014, provisional application No. 62/096,817, (Continued)

(51) Int. Cl.
*H01K 3/10* (2006.01)
*H05K 3/42* (2006.01)
(Continued)

(52) U.S. Cl.
CPC ............. *H05K 3/429* (2013.01); *H05K 1/116* (2013.01); *H05K 3/0094* (2013.01); *Y10T 29/49165* (2015.01)

(58) Field of Classification Search
CPC ....... H05K 3/0047; H05K 2201/09509; H05K 2201/09563; H05K 3/0035;
(Continued)

(56) References Cited

U.S. PATENT DOCUMENTS 4,951,762 A * 8/1990 Lundell ................ B23K 1/19
175/420.1
5,010,232 A 4/1991 Arai et al.
(Continued)

FOREIGN PATENT DOCUMENTS

| CN | 101530014 A | 9/2009 |
| JP | 03228396 | 10/1991 |

(Continued)

OTHER PUBLICATIONS

International Search Report and Written Opinion for PCT/US15/67736 dated Apr. 26, 2016; 11 pages.
(Continued)

*Primary Examiner* — Thiem Phan
(74) *Attorney, Agent, or Firm* — Loza & Loza, LLP; Julio M. Loza (57) ABSTRACT

A method for forming a hole plug in a laminate structure is provided. A laminate structure, is formed, including at least a dielectric layer and a first conductive foil on a first side of the dielectric layer. An unpierced or blind hole is formed in the laminate structure extending toward the first conductive foil from a second side of the dielectric layer and at least partially through the dielectric layer, the hole having a hole depth to hole diameter aspect ratio of less than twenty (20) to one (1). In yet another example, the hole aspect ratio may be less than one (1) to one (1). Via fill ink may then be deposited in the hole. The via fill ink is then dried and/or cured to form a hole plug.

20 Claims, 5 Drawing Sheets

Related U.S. Application Data filed on Dec. 24, 2014, provisional application No. 62/128,958, filed on Mar. 5, 2015.

(51) Int. Cl.
  *H05K 1/11* (2006.01)
  *H05K 3/00* (2006.01)

(58) Field of Classification Search
  CPC . H05K 2201/09545; H05K 2201/0959; H05K 3/46; Y10T 29/49165; Y10T 29/49155; Y10T 26/49126; Y10T 428/249996; Y10T 29/49124
  USPC ......... 29/852, 825, 829, 830, 832, 846, 593, 29/402.01, 402.06, 557, 558, 835, 837, 29/842
  See application file for complete search history.

(56) References Cited

U.S. PATENT DOCUMENTS

| | | | | |
|---|---|---|---|---|
| 5,315,072 A | * | 5/1994 | Arai | H05K 1/113 174/250 |
| 6,015,249 A | * | 1/2000 | Sacchetti | B23Q 1/58 408/10 |
| 6,884,945 B2 | * | 4/2005 | Kim | H05K 3/4623 174/262 |
| 8,846,444 B2 | * | 9/2014 | Bae | H01L 21/4803 438/106 |
| 9,900,978 B2 | * | 2/2018 | Su | H05K 3/429 |
| 2012/0234587 A1 | | 9/2012 | Nakamura et al. | |

FOREIGN PATENT DOCUMENTS

| | | | | |
|---|---|---|---|---|
| JP | 2001274204 A | | 10/2001 | |
| JP | 2002319763 A | | 10/2002 | |
| JP | 2002344144 A | | 11/2002 | |
| JP | 2008103548 | * | 5/2008 | ........... H05K 3/4069 |
| JP | 2008103548 A | | 5/2008 | |
| KR | 10-2009-0068227 A | | 6/2009 | |
| WO | 2008/047718 A1 | | 4/2008 | |

OTHER PUBLICATIONS

EP Patent Appln. 15874375.7. Extended EP Search Report (dated Jul. 24, 2018).

* cited by examiner

METHOD FOR FORMING HOLE PLUG

CLAIM OF PRIORITY

The present application claims priority to U.S. Provisional App. Ser. No. 62/096,011, filed Dec. 23, 2014, and U.S. Provisional App. Ser. No. 62/096,817, filed Dec. 24, 2014.

FIELD

Various features relate to laminate structures, and more particularly, to a method of forming hole plugs within thin laminate structures.

BACKGROUND

Laminate structures, such as printed circuit boards, are typically prepared by first laminating a sub-composite structure with additional exterior sheets/layers and/or other sub-composite structures. One or more holes may be formed (e.g. drilled) within the sub-composite for via holes. When laminates get thinner and holes get larger in diameter, using traditional hole filling materials and processes are inadequate.

Consequently, what is needed a way to create hole plugs in thin laminate structures in an efficient and cost effective way.

SUMMARY

A first aspect provides a method for forming a hole plug in a laminate structure. A laminate structure, is formed, including at least a dielectric layer and a first conductive foil on a first side of the dielectric layer. An unpierced or blind hole is formed in the laminate structure extending toward the first conductive foil from a second side of the dielectric layer and at least partially through the dielectric layer, the hole having a hole depth to hole diameter aspect ratio of less than twenty (5) to one (1). In another example, the hole aspect ratio (e.g., hole depth to hole diameter ratio) is less than three (3) to one (1). In yet another example, the hole aspect ratio may be less than one (1) to one (1). Via fill ink may then be deposited in the hole. The via fill ink is then dried and/or cured to form a hole plug.

The laminate structure may further include a second conductive foil on the second side of the dielectric layer, wherein the second conductive foil is pierced by the hole. Additionally, the laminate structure may further include a disposable layer on the second conductive foil.

A multilayer printed circuit board may then be formed with the laminate structure.

Additionally, a plated through hole may be formed through the hole plugged material. The hole may be formed with a drill having a point angle equal or greater than 125 degrees.

In one instance, the hole may be formed with a drill having a point angle equal or greater than 155 degrees. That is, the hole may have a bottom portion having corners with a point angle equal or greater than 155 degrees. In this manner, the drill may be configured to form a trimmed bottom corner within the hole. The bottom of the hole may be flat between the trimmed bottom corner (i.e., not a point).

In some examples, the via fill ink may be deposited by at least one of: (a) screen printing, (b) stencil printing, or (c) squeezing the via fill ink into the hole. In some instances, the via fill ink deposition is assisted by vacuum. In yet other instances the the via fill ink may be debubbled in a vacuum chamber (e.g., prior to curing).

In some instances, the via fill ink may be dried and/or cured within an oven. In some implementations, the vacuum drying and heat curing processes may be performed simultaneously to cure the via fill ink.

In some implementations, the first conductive foil may have a thickness of 12 ounce or less, 2 ounce or less, or 3 micron or less. In other implementations, the dielectric layer may have a thickness of 20 mil or less, 16 mil or less, or 12 mil or less.

The hole plug may be made from a plating resist or a material that prevents metal plating.

A second aspect provides a laminate structure with a hole plug. The laminate structure may include at least a dielectric layer and a first conductive foil on a first side of the dielectric layer. An unpierced or blind hole in the laminate structure may extend toward the first conductive foil from a second side of the dielectric layer, the hole having a hole depth to hole diameter aspect ratio of less than twenty (20) to one (1). Via fill ink may be deposited in the hole to form a hole plug. The laminate may further include a second conductive foil, wherein the second conductive foil is pierced by the hole. Multiple conductive and dielectric layers coupled to the laminate structure to form a multilayer printed circuit board.

Additionally, the laminate structure may include a plated through hole through the hole plugged material. In various examples, the hole aspect ratio may be three (3) to one (1) or less, or one (1) to one (1) or less. The hole may have a trimmed bottom corner. In one example, the trimmed bottom corner of the via hole may have a point angle equal or greater than 125 degrees. In another example, the trimmed bottom corner of the via hole may have a point angle equal or greater than 155 degrees.

In some instances, the first conductive foil may have a thickness of 12 ounce or less, 2 ounce or less, or 3 micron or less. In other instances, the dielectric layer may have a thickness of 20 mil or less, 16 mil or less, or 12 mil or less.

The hole plug may be a plating resist or a material that prevents metal plating.

A third aspect provides a method for forming a hole plug in a laminate structure. A laminate structure may be formed including a dielectric layer, a first conductive foil on a first side of the dielectric layer, and a second conductive foil on a second side of the dielectric layer. The second conductive foil may be masked and etched to form an opening on the second conductive foil that exposes a portion of the dielectric layer. Laser drilling may be done through the exposed portion of the laminate structure to form an unpierced or blind hole extending toward the first conductive foil and at least partially through the dielectric layer, the hole having a hole depth to hole diameter aspect ratio of less than twenty (20) to one (1). Via fill ink is deposited in the hole and cured to form a hole plug. The second conductive foil may be pierced by the hole.

The laminate structure may include a disposable layer on the second conductive foil.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation.

Exemplary Unpierced Thin Laminate Structure with a Filled Via Hole

Figure 1:
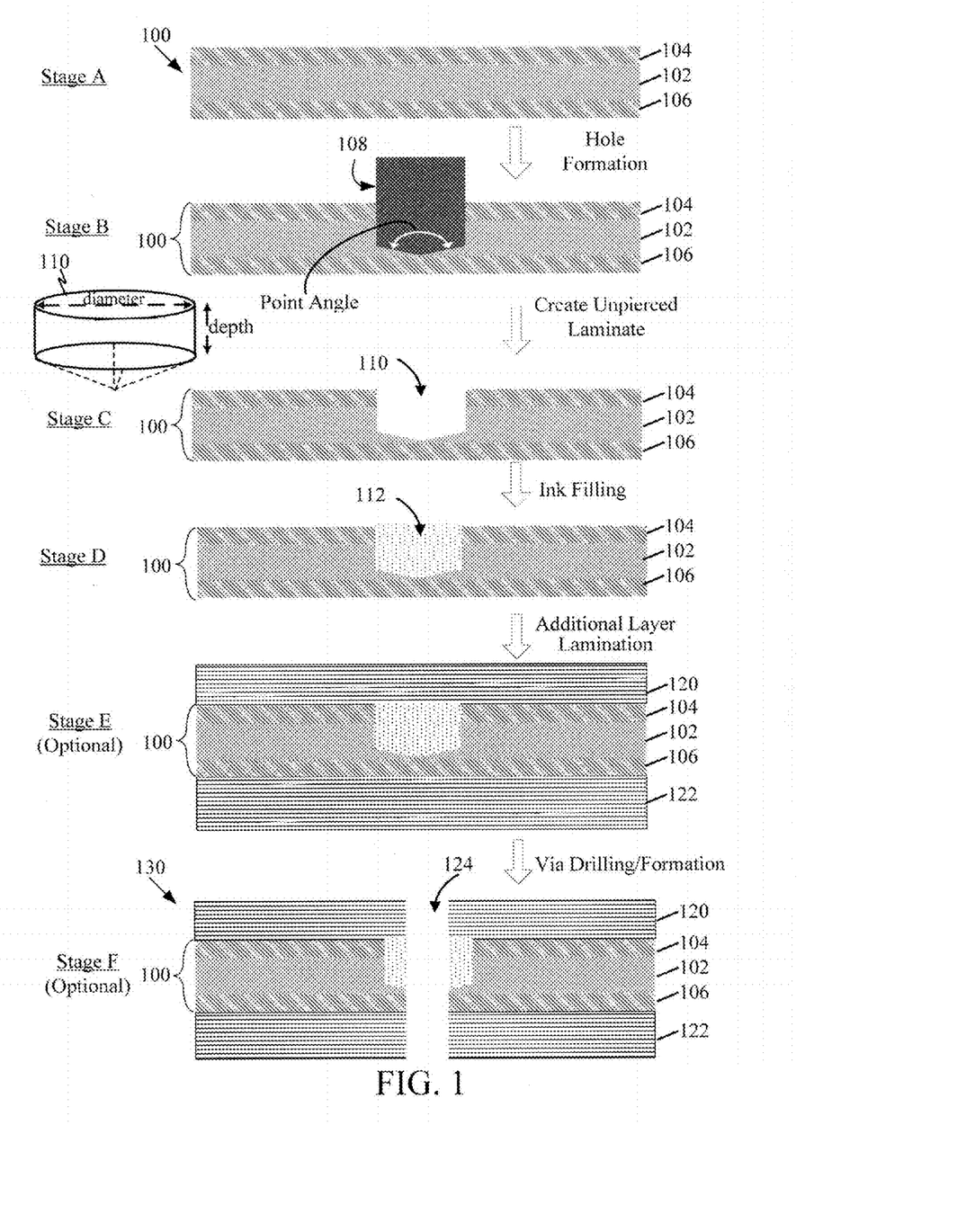
FIG. 1 illustrates a cross-section view of the construction of an unpierced laminate structure having a filled via hole.

FIG. 1 illustrates a cross-section view of the construction of an unpierced laminate structure 100 having a filled via hole. At a first stage (Stage A), the laminate structure 100 may be formed by including a dielectric layer 102 sandwiched between a first conductive layer or foil 106 (e.g., cooper foil) and/or a second conductive layer or foil 104. While a double sided laminate 100 is illustrated, a single sided laminate (i.e., one dielectric layer and one conductive layer or foil) and/or unclad laminate are also contemplated to be used. In one example, the first conductive layer or foil 106 and a second conductive layer or foil 104 may be selected from commonly available copper foil thickness, for example, approximately between 12 oz (320 micron thick or less) and 2 oz (70 micron thick or less). In one example, the dielectric layer 102 may have a thickness of 20 mil or less.

At a second stage (Stage B), a drill 108 may be used to form an unpierced or blind hole 110 through the second conductive layer or foil 104 and the dielectric layer 102, but not drill through or only partially drill through the first conductive layer or foil 106. In order to make the unpierced or blind hole 110 through at least the second conductive layer or foil 104 without piercing the first conductive layer or foil 106, the drill point angle may be equal to or greater than 125 degrees. Alternatively, the drilling machine used may have a depth sensor from the surface of the laminate structure 100 or drill depth. In yet another implementation, the drill machine may have sensors to sense when the drill contacts the second conductive layer or foil.

At a third stage (Stage C), the hole 110 has been formed within the unpierced laminate structure 100. Note that because a thin laminate 100 is used, the aspect ratio of the hole depth to the hole diameter may be 20:1 or less, 10:1 or less, 5:1 or less, 4:1 or less, 3:1 or less, 2:1 or less, 1:1 or less, 1:2 or less, 1:3 or less, or 1:10 or less. For example, if the hole depth may be 100 microns deep and the hole diameter may be 1 millimeter wide, then the aspect ratio (i.e., hole depth to hole diameter ratio) may be 1:10 or 0.1. Conventional via fill ink and hole filler machines are designed to work with through holes having aspect ratios of 5:1 or higher.

At a fourth stage (Stage D) a via fill ink 112 (or other similarly via fill material of similar viscosity) is deposited into the hole 110 using a hole filler machine. In one example, the hole filler machine may be feature a vacuum assisted process to prevent bubbles in the via fill ink. Once inserted in the hole 110, the via fill ink 112 may form a hole plug. In one example, the via fill ink 112 may be a plating resist material. According to various approaches, the via fill ink 112 may be deposited in the hole 110 by screen or stencil printing, by an ink dispenser, by a squeezing in on the surface and these process may be assisted by vacuum. In some implementations, the via formed on the surface of the laminate substrate 100 may be prepared with a disposable layer, so that after the via fill ink is deposited in the hole 110, the disposable layer can be removed to clean the surface of the laminate structure 100.

Because of the low aspect ratio of the hole depth to the hole diameter (e.g., aspect ratio of 20:1 or less, 10:1 or less, 5:1 or less, 4:1 or less, 3:1 or less, 2:1 or less, 1:1 or less, 1:2 or less, or 1:10 or less). It should be noted that conventional via fill material may not properly fill the hole 110 and a conventional filler machine may be a cause for bubbles in the hole plug. In the proposed approach, a proper viscosity and thixotropic property prepared via fill ink is used that allows it to flow in and fill the hole 110. In various examples, the via fill ink 112 may have a viscosity of 100-10000 deciPascal-second (dps-s) at 25 degrees Celsius, 200-1000 deciPascal-second (dps-s) at 25 degrees Celsius, and/or 200-500 deciPascal-second (dps-s) at 25 degrees Celsius, etc. The thixotropic index, the ratio of static viscosity to dynamic viscosity may be 2 or greater, preferably 3 or greater. In some implementations, the via fill ink 112 may also be screen printable, stencil printable, and/or squeeze fillable. The ink filler machine may feature vacuum assist and/or a heater to prevent bubbles in the ink.

During a subsequent plating process, if the via fill ink is a plating resist material, the via fill ink 112 may prevent conductive material from being plated between the first conductive layer or foil 106 and the second conductive layer or foil 104.

The via fill ink 112 may be cured or semi-cured. A vacuum dry process may be applied prior to via fill ink 112 heat cure process. Heat may be applied during vacuum dry to assist via fill ink debubbling. For example, the via fill ink 112 may be vacuum dried. In one example, the vacuum drying conditions may be a pressure of 360 millimeters of mercury (mmHg) or less, or 150 mmHg or less, for a length of time greater than 30 seconds at a set pressure or greater than 90 seconds at the set pressure. Heat may be applied to the via fill ink for further curing. Vacuum drying and heat curing processes may be performed simultaneously to cure the via fill ink.

At an optional fifth stage (Stage E), the laminate structure 100 may be added or laminated onto additional layers 120 and 122, such as a core structure and/or additional laminate structures, on either one side or both sides of the laminate structure 100 to form a multilayer structure 130. In one example, the additional laminate structures may include dielectric and conductive layers or foils. The conductive layers (e.g., conductive foils) may be patterned to form electrical paths or traces.

At an optional sixth stage (Stage F), a through-hole 124 may be drilled through the multilayer structure 130, including through the via fill ink 112. The through-hole 124 may have a diameter smaller than the diameter of the first formed hole 110 and or the via fill ink 112. The through-hole 124 may then be plated, for example, by placing the panel into a seed bath, followed by immersion in an electroless copper bath, followed by electrolytic plating.

Figure 2:
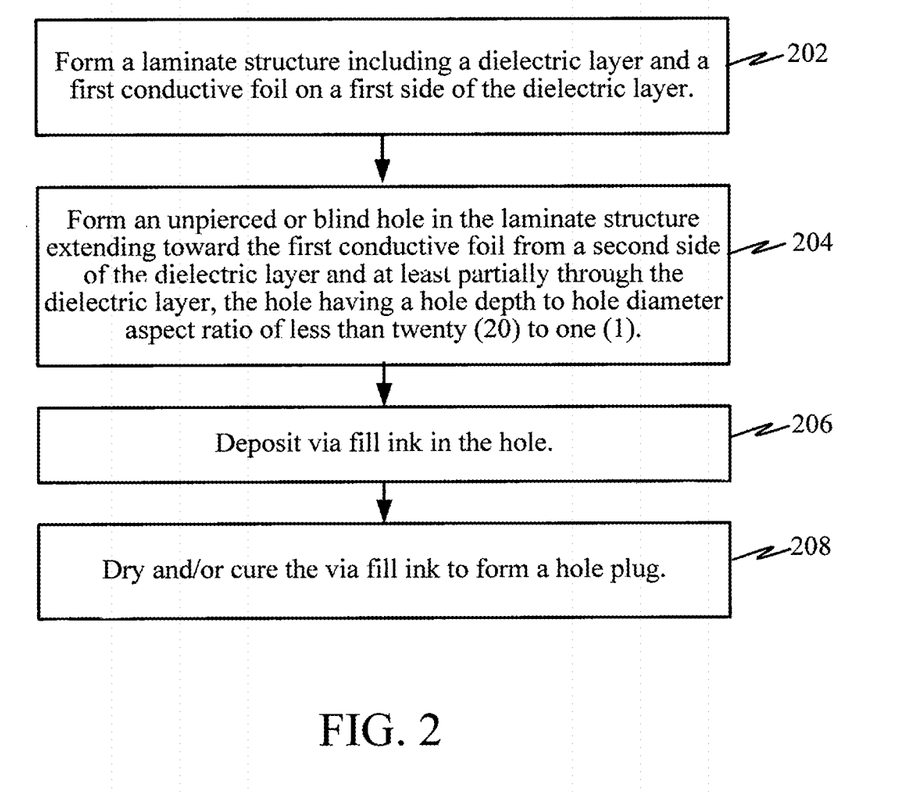
FIG. 2 is a flow diagram illustrating a method for forming an unpierced thin laminate structure with a hole plug.

FIG. 2 is a flow diagram illustrating a method for forming an unpierced thin laminate structure with a via fill hole plug. A laminate structure is formed including at least a dielectric layer and a first conductive foil on a first side of the dielectric layer 202.

An unpierced or blind hole is formed in the laminate structure extending toward the first conductive foil and at least partially through the dielectric layer, the hole having a hole depth to hole diameter aspect ratio of less than twenty (20) to one (1) 204. The aspect ratio (i.e., hole depth to hole diameter) may be, for example, 20:1 or less, 10:1 or less, 5:1 or less, 4:1 or less, 3:1 or less, 2:1 or less, 1:1 or less, 1:2 or less, or 1:10 or less. In one example, a drill is used to form the hole, the drill having a point angle equal or greater than 125 degrees or more or 155 degrees or more. Via fill ink may then be deposited in the hole 206. The via fill ink may be dried and/or cured to form a hole plug 208. A plated through hole may be subsequently formed through the hole plugged material. The hole plug may be a plating resist or a material that prevents metal plating.

Additionally, the laminate structure may further include a second conductive foil on the second side of the dielectric layer, wherein the second conductive foil is pierced by the hole. In one example, the laminate structure may further include a disposable layer on the second conductive foil. In one implementation, a multilayer printed circuit board may be formed with the laminate structure.

In one implementation, the hole may be formed with a drill having a point angle equal or greater than 125 degrees. Alternatively, the hole may be formed with a drill having a point angle equal or greater than 155 degrees. The drill may be configured to form a trimmed bottom corner within the hole.

In one example, the via fill ink may be deposited by at least one of: (a) screen printing, (b) stencil printing, or (c) squeezing the via fill ink into the hole.

In some implementations, the via fill ink deposition may be assisted by vacuum (e.g., in a vacuum chamber), to debbubble the via fill ink (i.e., remove bubbles from the via fill ink).

The drying and/or curing of the via fill ink may be done, for example, within an oven.

In one example, thermal cure process is simultaneously proceeded.

In various implementations, the first conductive foil may have a thickness of 12 ounce or less, 2 ounce or less, or 3 micron or less.

Figure 3:
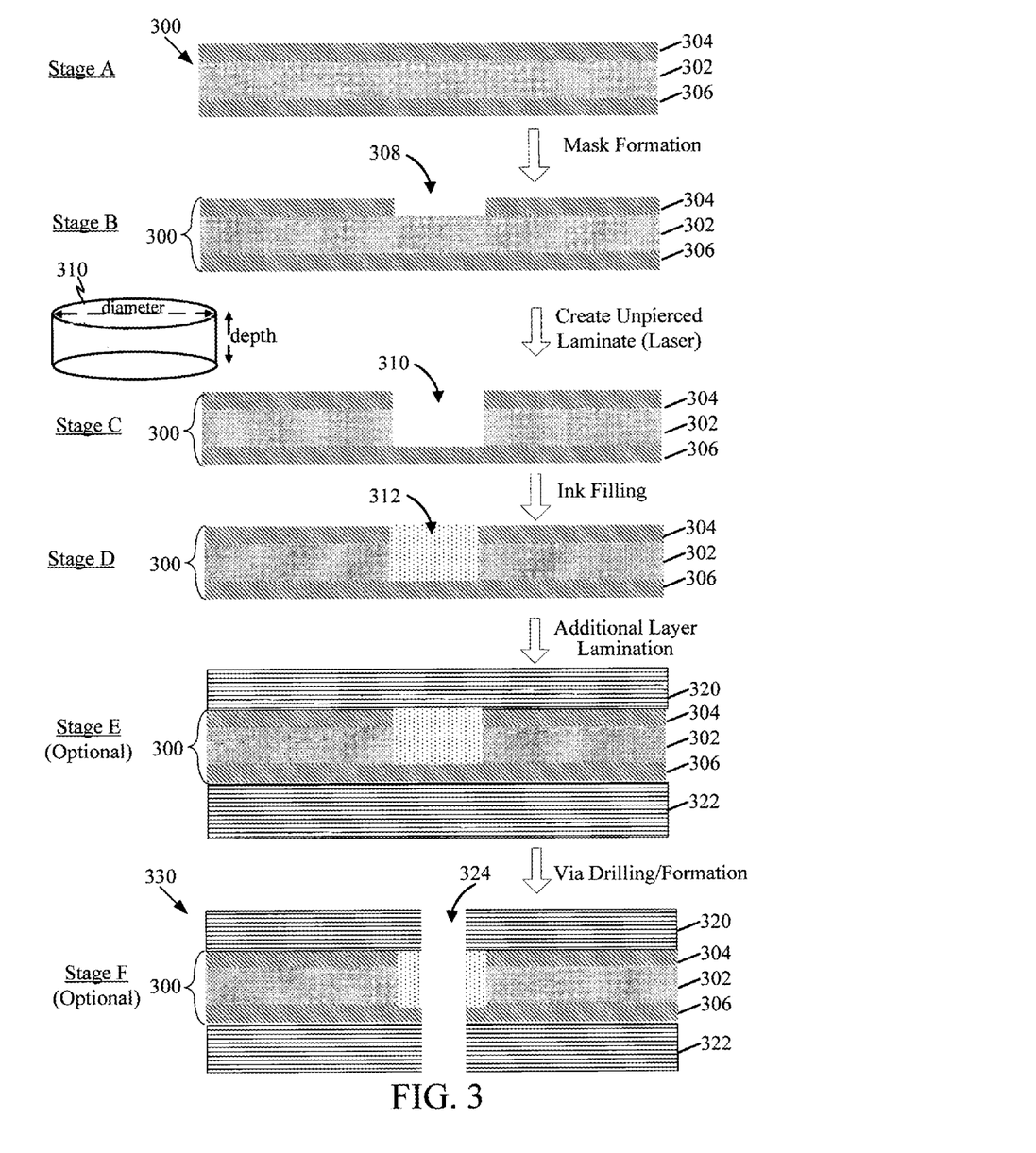
FIG. 3 illustrates a cross-section view of the construction of an unpierced laminate structure having a laser-drilled filled via hole.

In some implementations, the dielectric layer may have a thickness of 20 mil or less, 16 mil or less, or 12 mil or less.
Exemplary Unpierced Thin Laminate Structure with a Laser-Drilled Filled Via Hole FIG. 3 illustrates a cross-section view of the construction of an unpierced laminate structure 300 having a laser-drilled filled via hole. At a first stage (Stage A), the laminate structure 300 may be formed by including a dielectric layer 302 sandwiched between a first conductive layer or foil 306 (e.g., cooper foil) and/or a second conductive layer or foil 304. While a double sided laminate 300 is illustrated, a single sided laminate (i.e., one dielectric layer and one conductive layer or foil) and/or unclad laminate are also contemplated to be used. In one example, the first conductive layer or foil 306 and a second conductive layer or foil 304 may be selected from commonly available copper foil thickness, for example, approximately 12 oz (300 micron) thick or less, 2 oz (70 micron) thick or less, or 3 micron thick or less. In one example, the dielectric layer 302 may have a thickness of 20 mil or less (e.g., 16 mil or less, 12 mil or less, 8 mil or less).

At a second stage (Stage B), a conformal mask and etching process may be used to form an opening 308 on the second conductive layer or foil 304 which exposes the dielectric layer 302.

At a third stage (Stage C), laser drilling may be used to form an unpierced or blind hole 310 through the dielectric layer 302 of the laminate structure 300. In some examples, the laser may be a CO2 laser, a UV laser, or a complex CO2 and UV laser. If the laser aperture is not sufficient for the hole size, a common trepanning method may be used. The laser drill will be stopped by adjacent copper foil and it makes the hole is unpierced or blind.

At a fourth stage (Stage D) a via fill ink 312 (or other similarly via fill material of similar viscosity) is deposited into the hole 310 using a hole filler machine. In one example, the hole filler machine may be featured vacuum assisted process to prevent bubbles in the via fill ink. Once inserted in the hole 310, the via fill ink 312 may form a hole plug. In one example, the via fill ink 312 may be a plating resist material. According to various approaches, the via fill ink 312 may be deposited in the hole 310 by screen or stencil printing, by an ink dispenser, by a squeezing in on the surface and these process may be assisted by use of a vacuum. In some implementations, the surface of the laminate substrate 300 through which the via is formed may be prepared with a disposable layer, so that after the via fill ink 312 is deposited in the hole 310, the disposable layer can be removed to clean the surface of the laminate structure 300.

Because of the low aspect ratio of the hole depth to the hole diameter (e.g., aspect ratio of 20:1 or less, 10:1 or less, 5:1 or less, 4:1 or less, 3:1 or less, 2:1 or less, 1:1 or less, 1:2 or less, 1:10 or less), conventional via fill materials and/or processes do not work well.

It should be noted that conventional/thicker via fill material may not properly fill the hole 310 and a conventional filler machine may be a cause for bubbles in the hole plug. Here, a proper viscosity and thixotropic property prepared via fill ink is used that allows it to flow in and fill the hole 310. In various examples, the via fill ink 312 may have a viscosity of 100-10000 deciPascal-second (dps-s) at 25 degrees Celsius, 200-1000 deciPascal-second (dps-s) at 25 degrees Celsius, and/or 200-500 deciPascal-second (dps-s) at 25 degrees Celsius, etc. In some implementations, the via fill ink 312 may also be screen printable, stencil printable, and/or squeeze fillable. The ink filler machine may feature vacuum assist and/or heater to prevent bubbles in the ink.

During a subsequent plating process, if the via fill ink is a plating resist material, the void fill ink 312 may prevent conductive material from being plated between the second conductive layer or foil 304 and the first conductive layer or foil 306.

The via fill ink 312 may then be cured or semi-cured. Vacuum dry process may be applied prior to via fill ink 312 heat cure process. Heat may be applied during vacuum dry to assist via fill ink debubbling. For example, the via fill ink 312 may be vacuum dried. In one example, the vacuum drying conditions may be a pressure of 360 millimeters of mercury (mmHg) or less, or 150 mmHg or less, for a length of time greater than 30 seconds at a set pressure or greater than 90 seconds at the set pressure. The via fill ink may be applied heat for further cure. Vacuum dry and heat cure process may be proceeded simultaneously.

At an optional fifth stage (Stage E), the laminate structure 300 may be added or laminated onto additional layers 320 and 322, such as a core structure and/or additional laminate structures, on either one side or both sides of the laminate structure 300 to form a multilayer structure 330. In one example, the additional laminate structures may include dielectric and conductive layers or foils. The conductive layers (e.g., conductive foils) may be patterned to form electrical paths or traces.

At an optional sixth stage (Stage F), a through-hole 324 may be drilled through the multilayer structure 330, including through the via fill ink 312. The through-hole 324 may have a diameter smaller than the diameter of the first formed hole 310 and or the via fill ink 312. In one example, the through-hole 324 may then be plated, for example, by placing the panel into a seed bath, followed by immersion in an electroless copper bath, followed by electrolytic plating.

Figure 4:
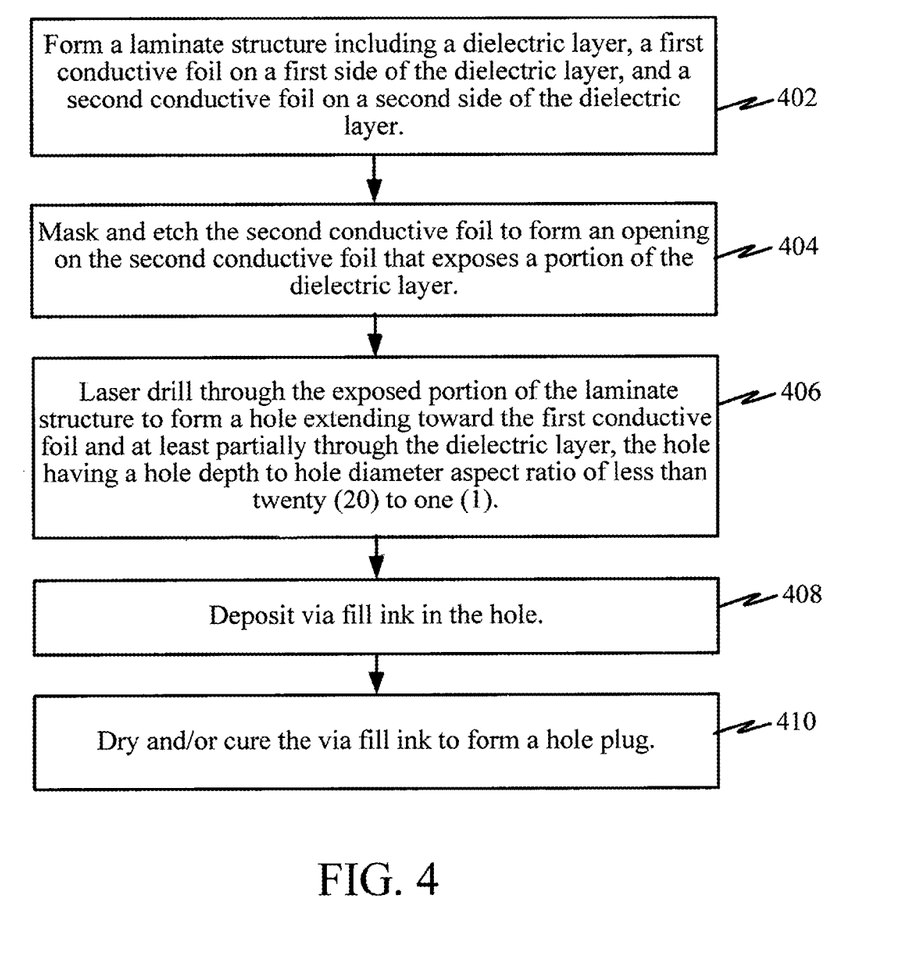
FIG. 4 is a flow diagram illustrating a method for forming a thin laminate structure with a hole plug.

FIG. 4 is a flow diagram illustrating a method for forming a thin laminate structure with a filled hole plug. A laminate structure is formed including a dielectric layer, a first conductive foil on a first side of the dielectric layer, and a second conductive foil on a second side of the dielectric layer 402. The second conductive foil may then be masked and etched to form an opening on the second conductive foil that exposes a portion of the dielectric layer 404. The exposed portion of the laminate structure may then be laser drilled to form an unpierced or blind hole extending toward the first conductive foil and at least partially through the dielectric layer, the hole having a hole depth to hole diameter aspect ratio of less than twenty (20) to one (1) 406. Via fill ink may then be deposited in the hole 408 and cured to form a hole plug 410. The second conductive foil is pierced by the hole. A plated through hole may be formed through the hole plugged material. The hole plug may be a plating resist or a material that prevents metal plating.

Additionally, the laminate structure may further include a disposable layer on the second conductive foil. In one example, a multilayer printed circuit board may be formed with the laminate structure.

In various examples, the hole aspect ratio (via hole depth to diameter ratio) may be, for instance, twenty (20) to one (1) or less, ten (10) to one (1) or less, five (5) to one (1) or less, four (4) to one (1) or less, three (3) to one (1) or less, or two (2) to one or less, or one (1) to one (1) or less, or one (1) to two (2) or less. In other implementations, the hole aspect ratio (via hole depth to diameter ratio) may be, for instance, between twenty (20) to one (1) and one (1) to one (1), between ten (10) to one (1) and one (1) to one (1), between five (5) to one (1) and one (1) to one (1), between four (4) to one (1) and one (1) to one (1), between three (3) to one (1) and one (1) to two (2), or between two (2) to one (1) and one (1) to one (1) or one (1) to two (2). In various implementations, the via fill ink may be deposited by at least one of: (a) screen printing, (b) stencil printing, and (c) squeezing the via fill ink into the hole.

In some implementations, the via fill ink deposition may be assisted by vacuum (e.g., done within a vacuum chamber) to debubble the via fill ink (i.e., to remove bubbles from the via fill ink).

In one example, the via fill ink may be cured within an oven. The thermal cure process may be simultaneously proceeded.

In various examples, each of the first conductive foil and second conductive foils may have a thickness of 12 ounce or less, 2 ounce or less, or 3 micron or less.

In other examples, the dielectric layer has a thickness of 20 mil or less, 16 mil or less, or 12 mil or less.

Exemplary Drill for Hole Formation

Figure 5:
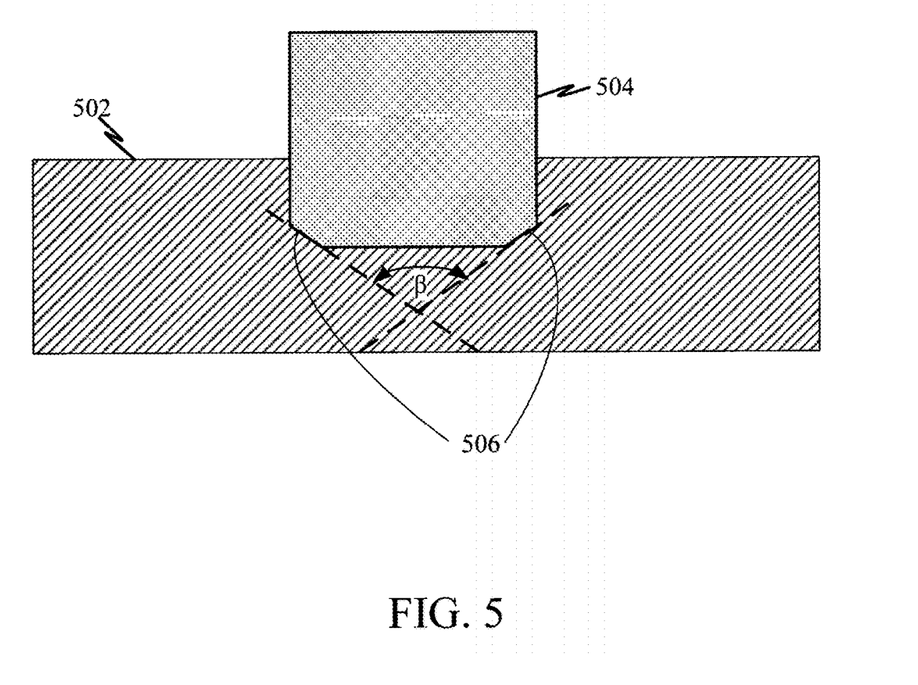
FIG. 5 illustrates an exemplary drill that may be used to for a hole in accordance with FIGS. 1 and 2.

FIG. 5 illustrates an exemplary drill that may be used to for a hole in accordance with FIGS. 1 and 2. Here a laminate structure 502 (e.g., comprising a dielectric layer and one or more conductive layers or foils) may have a hole formed by a drill 504 that is shaped or configured to form a trimmed bottom corner within the hole. For example, the drill may have a point angle β equal or greater than 125 degrees or a point angle equal or greater than 155 degrees. Because the hole depth may be rather shallow (relative to the hole diameter), such drill point angle may be necessary to form a hole capable of accepting the via fill ink.

Note that the aspects of the present disclosure may be described herein as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A method for forming a hole plug, comprising:
    forming a laminate structure including at least a dielectric layer and a first conductive foil on a first side of the dielectric layer, the dielectric layer including a second side separate from the first side by a thickness of the dielectric layer;
    forming a blind hole in the laminate structure with a drill having a point angle greater than 125 degrees, the blind hole extending toward the first conductive foil from the second side of the dielectric layer, the blind hole extending through the dielectric layer a threshold distance of the thickness of the dielectric layer, the blind hole having a hole depth to hole diameter aspect ratio of less than twenty (20) to one (1);
    depositing via fill ink in the blind hole; and
    drying or curing the via fill ink to form a hole plug.

2. The method of claim 1, further comprising:
    forming the laminate structure to further include a second conductive foil on the second side of the dielectric layer, wherein the second conductive foil is pierced by the blind hole.

3. The method of claim 2, further comprising:
    forming the laminate structure to further include a disposable layer on the second conductive foil.

4. The method of claim 1, further comprising:
    using a depth sensor to determine the threshold distance.

5. The method of claim 1, further comprising:
    determining the hole depth of the blind hole;
    determining the hole diameter of the blind hole; and
    determining the hole diameter aspect ratio based at least in part on the hole depth and the hole diameter.

6. The method of claim 1, further comprising:
determining the hole diameter aspect ratio meets a threshold hole diameter aspect ratio before depositing the via fill ink in the blind hole.

7. The method of claim 1, wherein forming the blind hole in the laminate structure with a drill having a point angle greater than 125 degrees comprises:
forming the blind hole in the laminate structure with a drill having a point angle of at least 155 degrees.

8. The method of claim 1, further comprising:
determining via fill ink that satisfies at least one via fill ink property, wherein depositing the via fill ink includes utilizing the determined via fill ink.

9. The method of claim 1, further comprising:
depositing the via fill ink using one of a screen printing technique, a stencil printing technique, or by squeezing the via fill ink into the blind hole.

10. A method, comprising:
forming a laminate structure that includes a dielectric layer and a conductive foil on a first side of the dielectric layer, the dielectric layer including a second side separate from the first side by a thickness of the dielectric layer; and
forming a blind hole in the laminate structure with a drill having a point angle greater than 125 degrees, the blind hole extending toward the conductive foil from the second side of the dielectric layer, the blind hole extending through the dielectric layer a threshold distance of the thickness of the dielectric layer.

11. The method of claim 10, comprising:
depositing via fill ink in the blind hole; and
forming a hole plug by curing the via fill ink.

12. The method of claim 11, further comprising:
using a vacuuming technique to deposit the via fill ink.

13. The method of claim 11, further comprising:
determining via fill ink that satisfies at least one via fill ink property, wherein depositing the via fill ink includes utilizing the determined via fill ink.

14. The method of claim 13, wherein the via fill ink property includes at least one of a viscosity property or a thixotropic property.

15. The method of claim 14, wherein the thixotropic property includes a ratio of a static viscosity to a dynamic viscosity that satisfies a threshold thixotropic ratio.

16. The method of claim 10, further comprising:
masking and etching a second conductive foil to form an opening on the second conductive foil.

17. The method of claim 16, wherein forming the blind hole in the laminate structure with a drill having a point angle greater than 125 degrees comprises:
forming the blind hole in the laminate structure with a drill having a point angle of at least 155 degrees.

18. A laminate structure, comprising:
a dielectric layer, the dielectric layer having a conductive foil on a first side, a blind hole extending toward a first conductive foil from a second side of the dielectric layer, the blind hole shaped by a drill having a point angle greater than 125 degrees and extending through the dielectric layer a threshold distance of a thickness of the dielectric layer.

19. The laminate structure of claim 18, wherein the blind hole is associated with a hole depth and a hole diameter, a ratio of the hole depth to hole diameter satisfying a threshold hole diameter aspect ratio.

20. The laminate structure of claim 18, wherein the dielectric layer includes a through-hole through the via fill ink, wherein the blind hole is associated with a first diameter and the through-hole is associated with a second diameter, the second diameter being less than the first diameter.

* * * * *